(12) United States Patent
Lim et al.

(10) Patent No.: US 7,518,214 B2
(45) Date of Patent: Apr. 14, 2009

(54) SEMICONDUCTOR DEVICE AND METHOD OF FABRICATING THE SAME

(75) Inventors: Dong-chan Lim, Yongin-si (KR); Byung-hee Kim, Seoul (KR); Tae-ho Cha, Seongnam-si (KR); Hee-sook Park, Seoul (KR); Geum-jung Seong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 139 days.

(21) Appl. No.: 11/586,610

(22) Filed: Oct. 26, 2006

(65) Prior Publication Data

US 2007/0099365 A1    May 3, 2007

(30) Foreign Application Priority Data

Oct. 27, 2005  (KR) ...................... 10-2005-0101985

(51) Int. Cl.
*H01L 29/00* (2006.01)
(52) U.S. Cl. .................. 257/538; 257/347; 257/505; 257/E21.17; 257/E21.231; 257/E21.229; 257/E21.267; 257/E21.304; 257/E21.545; 257/E21.547; 257/E21.561
(58) Field of Classification Search ............... 257/65, 257/381, 382, 347, 505, 508, 576, 622, 701
See application file for complete search history.

(56) References Cited

U.S. PATENT DOCUMENTS 5,783,475 A * 7/1998 Ramaswami ................ 438/303
6,165,826 A * 12/2000 Chau et al. .................. 438/231
6,743,684 B2 * 6/2004 Liu ............................. 438/300
7,176,522 B2 * 2/2007 Cheng et al. ................ 257/338

FOREIGN PATENT DOCUMENTS

| KR | 1020000040110 A | 7/2000 |
|----|------------------|--------|
| KR | 1020000043200 A | 7/2000 |
| KR | 1020010045401 A | 6/2001 |

\* cited by examiner

*Primary Examiner*—David Nhu
(74) *Attorney, Agent, or Firm*—Volentine & Whitt, PLLC

(57) ABSTRACT

An integrated circuit of a semiconductor device has a line type of pattern that is not prone to serious RC delays. The integrated circuit has a line formed of at least a layer of polycrystalline silicon, a layer of metal having a low sheet resistance, and a layer of a barrier metal interposed between the polycrystalline silicon and the metal having a low sheet resistance, and first spacers disposed on the sides of the line, respectively, and is characterized in that the line has recesses at the sides of the barrier layer and the first spacers fill the recesses. The integrated circuit may constitute a gate line of a semiconductor device. The integrated circuit is formed by forming layers of polycrystalline silicon, metal having a low sheet resistance, and a barrier metal one atop the other, patterning the layers into a line, etching the same to form the recesses, and then forming the first spacers. The etching is preferably a process of etching the barrier layer in situ using an etchant having an etch selectivity between the material of the barrier layer and the materials constituting the other layers of the line.

12 Claims, 7 Drawing Sheets

SEMICONDUCTOR DEVICE AND METHOD OF FABRICATING THE SAME

BACKGROUND OF THE INVENTION

1. Field of the Invention

The present invention relates to a semiconductor device and to a method of fabricating the same. More particularly, the present invention relates to an integrated circuit having a line type of pattern and to a method of fabricating the same 2. Description of the Related Art The design rule of a line type of circuit pattern of today's highly integrated semiconductor devices is now at a deep sub-micron level. However, the lines of an integrated circuit having a design rule on this low of an order are prone to experiencing serious RC delays. Therefore, a high fusion point metal, such as tungsten, having low sheet resistance has been used to form the lines of the circuit patterns. In particular, high fusion point metals have been used to form gate electrodes, bit lines, and other parts of a line type of circuit pattern.

However, a gate insulating film of a semiconductor device may be contaminated if only a high fusion point metal layer were used to form the gate electrode of the device. Accordingly, a gate electrode typically will have a stacked structure which includes a gate line made of polycrystalline silicon doped with impurities, and a line of the high fusion point metal disposed on the polycrystalline gate line. Also, a barrier layer is formed between the polycrystalline silicon gate line and the metal layer to prevent a layer of silicide from forming at the interface between the polycrystalline silicon and the high fusion point metal layer during a subsequent heat treatment process. However, the relatively great interfacial resistance between the barrier layer and the poly-crystalline silicon compromises the response time of the semiconductor device. A lower interfacial resistance can be provided by forming an ohmic layer between the polycrystalline silicon and the metal layer.

In light of the above, a typical gate electrode is fabricated by sequentially performing deposition processes to form poly-crystalline silicon, ohmic, barrier, and metal layers, patterning the layers, and subjecting the layers to an oxidation process. The oxidation process cures defects or eliminates hot carriers which may occur in some of the layers during the fabricating process.

However, the oxidation of the barrier layer as a result of this oxidation process reduces the overall quality of the semiconductor device.

SUMMARY OF THE INVENTION

Accordingly, an object of the present invention is to solve the above-mentioned problems of the prior art.

A specific object of the present invention is to provide an integrated circuit device in which serious RC delays do not occur and yet which can have a high degree of integration.

Likewise, another object of the present invention is to provide a method of fabricating an integrated circuit device in which serious RC delays will not occur and yet which lends itself to the fabricating of highly integrated circuit devices.

Still another object of the present invention is to provide an integrated circuit device having a line made up of a barrier metal layer interposed between polycrystalline silicon and metal having a low sheet resistance, and wherein the barrier metal layer does not show any appreciable signs of oxidation.

Likewise, another object of the present invention is to provide a method of fabricating an integrated circuit device having a line made up of a barrier metal layer interposed between polycrystalline silicon and metal having a low sheet resistance, and comprising an oxidation process to cure defects in the integrated circuit and yet wherein the barrier metal layer is not oxidized by the oxidation process.

According to one aspect of the present invention, there is provided an integrated circuit device comprising a line, and first spacers disposed on sides of the line, respectively, characterized in that the line includes a barrier metal layer interposed between polycrystalline silicon and metal having a low sheet resistance, the line has recesses in the sides thereof at the sides of the barrier layer, and the first spacers fill the recesses.

According to another aspect of the present inventions there is provided a semiconductor device which includes a semiconductor substrate having source/drain regions, a gate insulating film disposed on a channel region between the source/drain regions, a gate electrode disposed on the gate insulating film, a hard mask disposed on the gate electrode, first spacers disposed on sides of the gate electrode, the gate electrode comprising a polycrystalline silicon layer, an ohmic layer, a barrier layer, and a metal layer, and wherein the device is characterized in that the gate electrode has recesses therein at the sides the barrier layer, and each of the first spacers extends over a side of the hard mask, a side of the metal layer, a side of the barrier layer, side of the ohmic layer, and an upper side portion of the polycrystalline silicon layer such that the first spacers fill the recesses.

According to another aspect of the present invention, there is provided a method of fabricating an integrated circuit, which method includes forming a line on a substrate, wherein the line comprises polycrystalline silicon, a layer of metal having a low sheet resistance, and a layer of a barrier metal interposed between the polycrystalline silicon and the metal having a low sheet resistance, subsequently forming spacers on sides of the line, respectively, such that the spacers extend into and occupy the recesses; and subsequently subjecting the substrate to an oxidation process.

According to another aspect of the present invention, there is provided a method of fabricating a semiconductor device which method includes forming a gate insulating film, a polycrystalline silicon layer, an ohmic layer, a barrier layer, and a metal layer on a semiconductor substrate, forming a hard mask on the metal layer, patterning the metal layer, the barrier layer, the ohmic layer, and the poly-crystalline silicon, forming recesses in the resulting pattern at both sides of the barrier layer, respectively, forming first spacers each of which extends over at least a side of the hard mask, a side of the patterned metal layer, barrier layer, and ohmic layer, and a side portion of the patterned polycrystalline silicon layer, and etching the patterned polycrystalline silicon layer and the gate insulating film using the first spacers and the hard mask as an etch mask.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
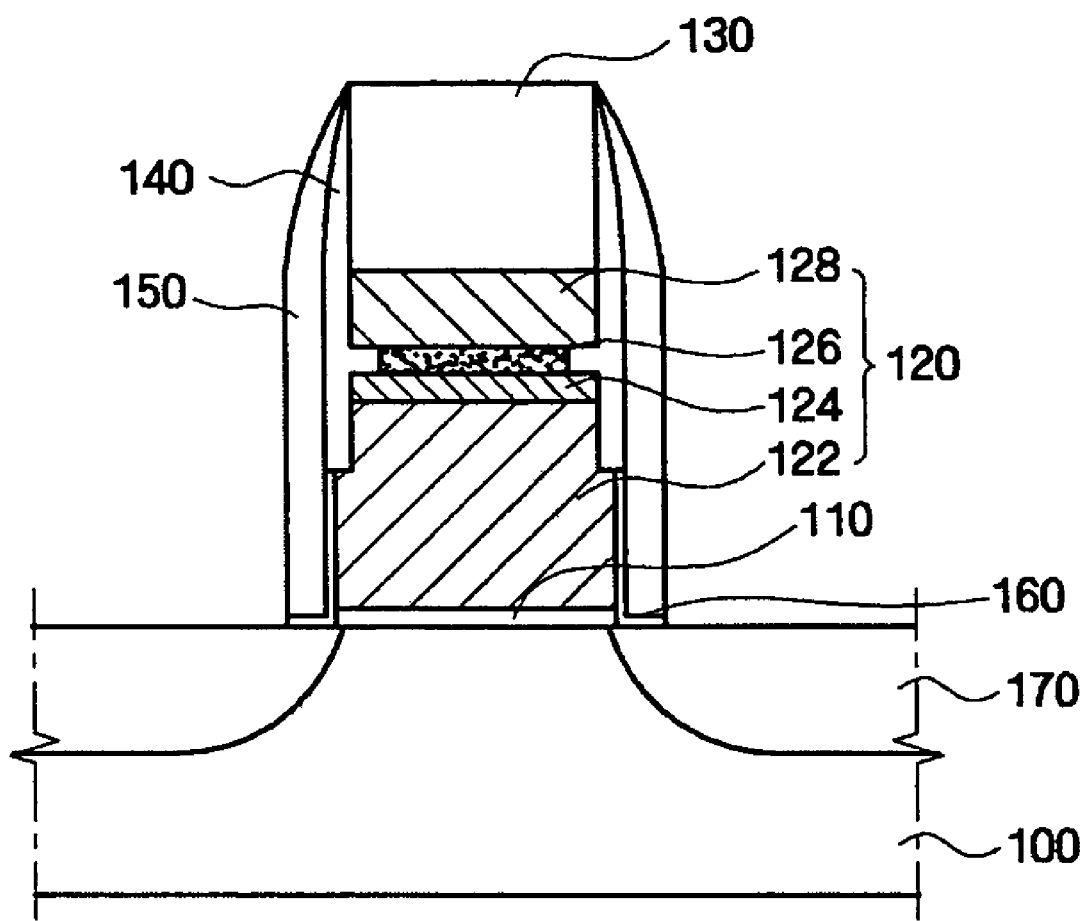
FIG. 1 is a cross-sectional view of a semiconductor device according to the present invention.

The present invention will be described in detail hereinafter with reference to the accompanying drawings. In this respect, the same reference numerals are used to designate like elements throughout the drawings.

Referring first to FIG. 1, a semiconductor device according to the present invention has a substrate 100 divided into an active region and an inactive region by an isolation film (not shown) such as a shallow trench isolation (STI) or field oxide (FOX) film. The substrate 100 may be a substrate of Si, Ge, SiGe, GaP, GaAs, SiC, SiGeC, InAs, or InP, or a silicon-on-insulator (SOI) substrate. A portion of the active region may be treated so that the active region provides the desired threshold voltage. For example, in the case in which the substrate 100 is a p-type of semiconductor substrate, a section of the active region is doped with p-type impurities. This section may be referred to as a threshold voltage adjusting portion of the active region.

A gate insulating film 10 is disposed on the active region of the substrate. The gate insulating film 110 may be made of $SiO_x$ or SiON.

A gate electrode 120 is disposed on the gate insulating film 110. The gate electrode 120 is a multi-layered structure consisting of a polycrystalline silicon layer 122, an ohmic layer 124, a barrier layer 126, and a metal layer 128. The barrier layer 126 and the ohmic layer 124 are interposed between the polycrystalline silicon layer 122 and the metal layer 128.

The metal layer 128 is of a metal having low sheet resistance. Thus, the metal layer 128 may be of tungsten (W), rhenium (Re), tantalum (Ta), osmium (Os), molybdenum (Mo), niobium (Nb), vanadium (V), hafnium (Hf), zirconium (Zr) or titanium (Ti). Preferably, though, the metal layer 128 is of tungsten (W) because a tungsten layer is relatively easy to form using conventional semiconductor device fabricating processes. In any case, the RC delay of the integrated circuit of the semiconductor device is minimized because of the low sheet resistance of the metal layer 128. Hence, the operating speed of the semiconductor device is enhanced.

The barrier layer 126 prevents a layer of silicide from forming on the metal layer 128 during a heat treatment process carried out after the barrier layer 126 has been formed. Accordingly, the barrier layer 126 may consist of a nitride layer. Specifically, the barrier layer 126 may be a layer of titanium nitride (TiN), tantalum nitride (TaN); or boron nitride (BN).

The barrier layer 126 is narrower than the metal layer 128 and the ohmic layer 124. Consequently, the gate electrode 120 has recesses in the sides thereof between the metal layer 128 and the ohmic layer 124. As an example, the maximum width of the gate electrode 120 is about 500 Å, whereas the width of the barrier layer 126 is in the range of about 350 Å to 450 Å.

The ohmic layer 124 provides an interfacial resistance that is less than that which would otherwise be present at an interface between the polycrystalline silicon layer 122 and the metal layer 128. The ohmic layer 124 may be a metal silicide layer. If the metal layer 128 is a layer of tungsten (W), the ohmic layer 124 is a layer of tungsten silicide ($WSi_x$). Otherwise, the metal layer 128 may be a layer of titanium silicide ($TiSi_x$), tantalum silicide ($TaSi_x$), cobalt silicide ($CoSi_x$), or molybdenum silicide ($MoSi_x$).

The polycrystalline silicon layer 122 comprises polycrystalline silicon doped with impurities. For example, the polycrystalline silicon may be doped with n-type impurities only. Alternatively, the polycrystalline silicon may be doped with n-type impurities and p-type impurities wherein the concentration of the p-type impurities is lower than that of the n-type impurities.

A hard mask 130 used in the forming of the gate electrode 120 is disposed on the gate electrode 120. First spacers 140 are disposed on the sides, respectively, of the hard mask 130, the metal layer 128, the barrier layer 126, the ohmic layer 124, and a portion of the polycrystalline silicon layer 122. The first spacers 140 may be constituted by an oxide film or a nitride film. Also, the first spacers 140 fill the recesses in the gate electrode 120 at both sides of the barrier layer 126.

More specifically, the first spacer 140 on each side of the gate electrode 120 has a main portion whose width gradually increases toward a lower portion thereof. In addition, the first spacer 140 on each side of the gate electrode 120 has a projection that extends into and occupies a recess in the gate electrode 120 at a respective side of the barrier layer 126. Thus, the width of the projection essentially corresponds to the width of the recess. In the case of the gate electrode 120 having a width of about 500 Å, for example, each first spacer 140 preferably has a width of about 50 Å to 100 Å adjacent the barrier layer 126, and each first spacer 140 preferably has a width of about 25 Å to 50 Å at the lower portion thereof Second spacers 150 are formed on the first spacers 140, respectively, and extend over of that portion of the polycrystalline silicon layer 122 not covered by the first spacers 140. The second spacers 150 may be constituted by an oxide film or a nitride film. Also, the second spacers 150 may or may not be made of the same material as that of the first spacers 140.

A thin oxide film 160 extends over portions of the polycrystalline silicon layer 122 which are not covered by the first spacer 140, and along portions of the substrate 100 that lie beneath the second spacers 150.

Source/drain regions 170 are located on both sides of the gate electrode 120. In the case in which the substrate 100 is a p-type of semiconductor substrate, the source/drain regions 170 are regions of the substrate 100 doped with n-type impurities, for example.

In a semiconductor device having the structure described above, the relatively thick portions of the first spacers 140 prevent the oxidation of the barrier layer 126. On the other hand, the first spacers 140 need not protrude outwardly far from the sides of the gate electrode 120. In other words, the first spacers 140 may be thin as viewed from the top of the gate electrode 120, unlike typical sidewall spacers. Therefore, the first spacers 140 do not contribute much to the size of the semiconductor device, i.e., the first spacers 140 do not impose any significant limitations on the degree to which the semiconductor device can be integrated.

A method of fabricating the semiconductor device according to the present invention will now be described with reference to FIGS. 2 through 10.

Figure 2:
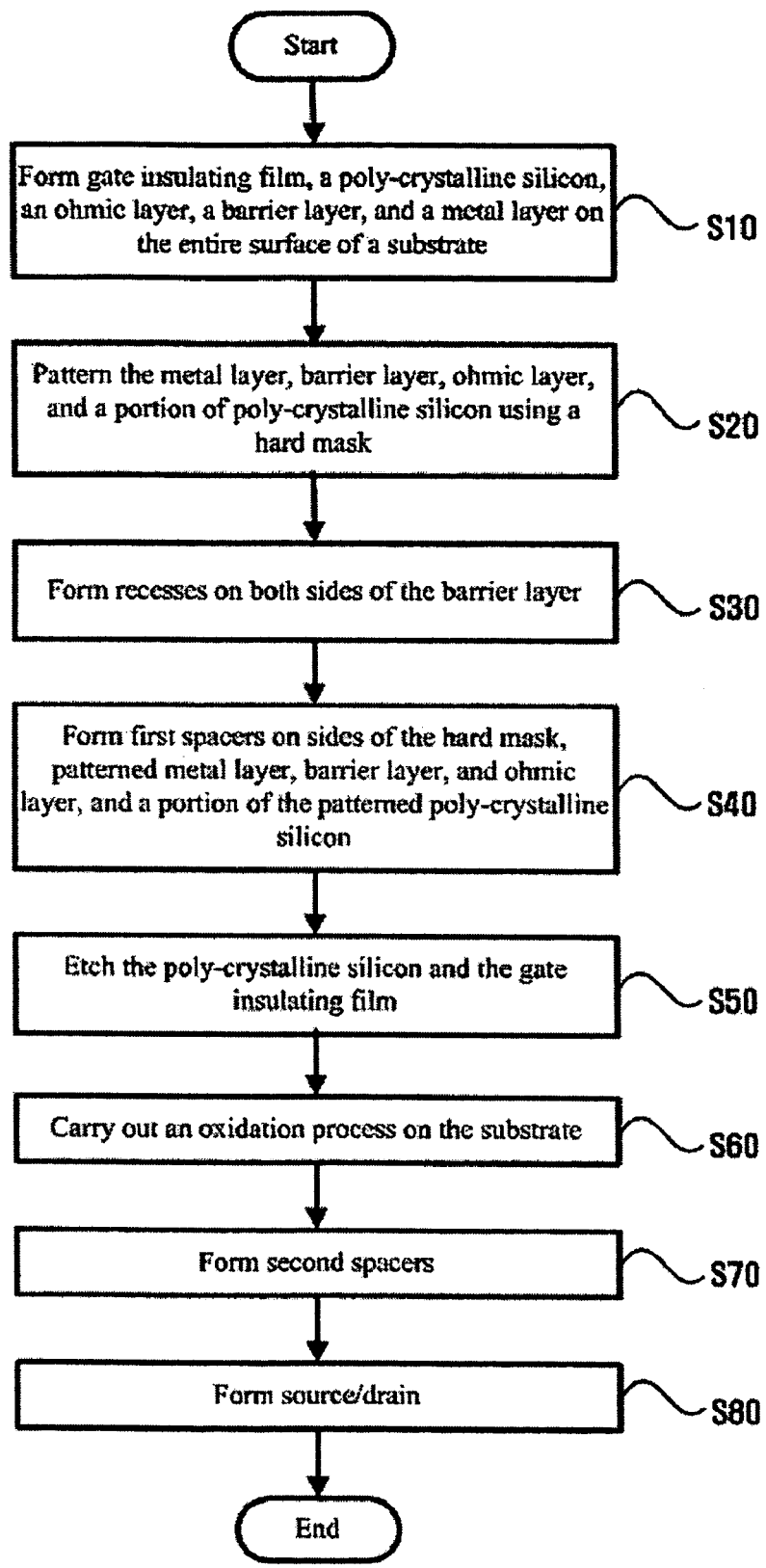
FIG. 2 is a flowchart of a process of fabricating a semiconductor device according to the present invention.
Figure 3:
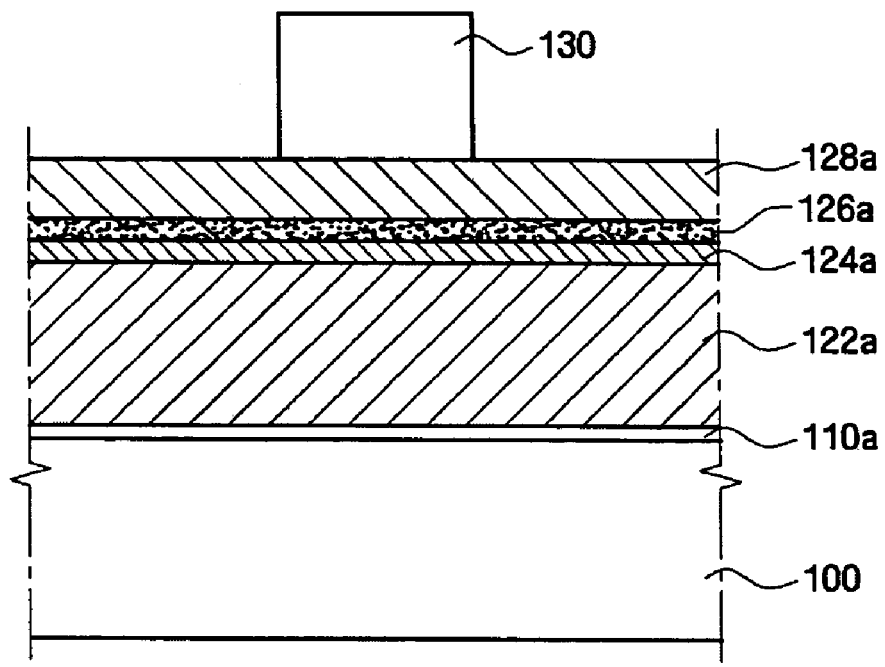
FIGS. 3 through 10 are cross-sectional views of a substrate illustrating, in sequence, a process of fabricating a semiconductor device according to the present invention.

Referring first to FIGS. 2 and 3, an isolation film (not shown) is formed to divide the substrate 100 into an active region and an inactive region. Then, a gate insulating film 110a, a polycrystalline silicon layer 122a, an ohmic layer 126a, a barrier layer 124a, and a metal layer 128a are formed over the entire surface of the semiconductor substrate 100 (S10).

The gate insulating film 110 may comprise a silicon oxide film formed by thermally oxidizing the substrate 100, a film of SiON, $Ge_xO_yN_z$, $Ge_xSi_xO_z$, a high dielectric constant material, or a composite thereof, or a laminate formed by sequentially forming layers of these materials on one another. Examples of suitable high dielectric constant materials are $HfO_2$, $ZrO_2$, $Al_2O_3$, $Ta_2O_5$, hafnium silicate, zirconium silicate, and composites thereof.

The polycrystalline silicon layer 122a is a layer of polycrystalline silicon having impurities. For example, the polycrystalline silicon layer 122a can be a layer of polycrystalline silicon doped with n-type impurities using an ion implantation process. The n-type impurities may be phosphorous (P) or arsenic (As).

The ohmic layer 124a may be formed by chemical vapor deposition (CVD) or physical vapor deposition (PVD). Alternatively, a constituent of the ohmic layer 124a may be deposited over the entire surface of the substrate 100, and be then subjected to a heat treatment process. In this case, the ohmic layer 124a may be made of titanium silicide ($TiSi_x$), tantalum silicide ($TaSi_x$), cobalt silicide ($CoSi_x$), tungsten silicide ($WSi_x$), or molybdenum silicide ($MoSi_x$).

Then, the barrier layer 126a and the metal layer 128a are sequentially formed on the ohmic layer 124a. The barrier layer may be a layer of titanium nitride (TiN), tantalum nitride (TaN), or boron nitride (BN). Thus, the barrier layer 126a may be formed by CVD, PVD, or atomic layer deposition (ALD). The metal layer 128a may consist of tungsten (W), rhenium (Re), tantalum (Ta), osmium (Os), molybdenum (Mo), niobium (Nb), vanadium (V), hafnium (Hf), zirconium (Zr), or titanium (Ti).

The hard mask 130 is formed on the metal layer 128a to define the gate electrode. The hard mask 130 may be made of PE-SiN (plasma enhanced silicon nitride) or LP-SiN (low pressure silicon nitride).

Figure 4:
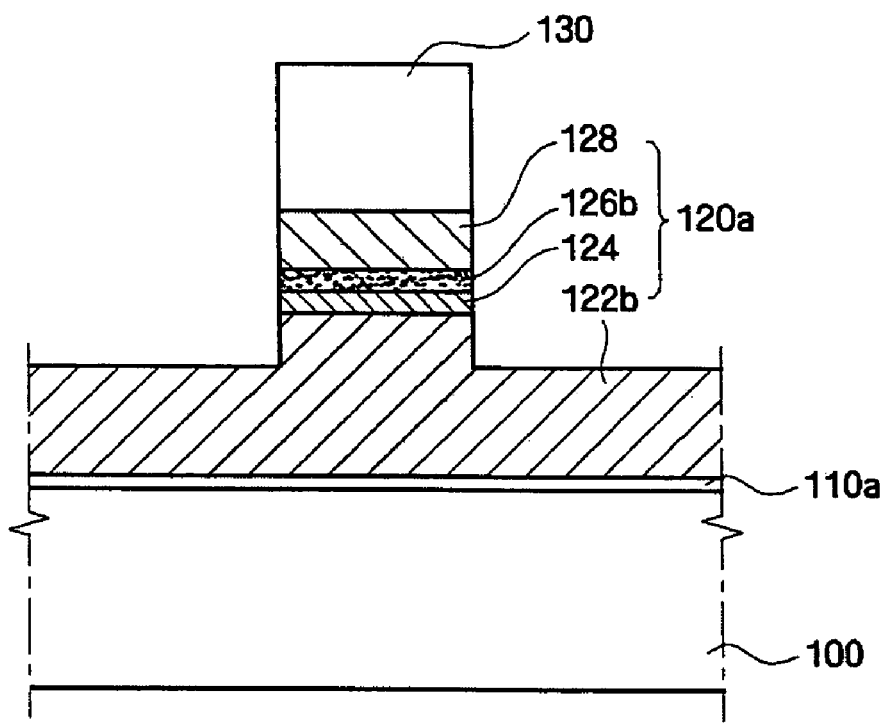

Referring to FIGS. 2 and 4, the metal layer 128a, the barrier layer 126a, the ohmic layer 124a, and the polycrystalline silicon layer 122a are patterned (S20). Specifically, the metal layer 128a, the barrier layer 126a, the ohmic layer 124a, and the polycrystalline silicon layer 122a are etched using the hard mask 130 as an etch mask (S20). In this case, only an upper portion of the poly-crystalline silicon 122a is etched away. Thus, a stacked structure or line comprising the hard mask 130, a patterned metal layer 128, a patterned barrier layer 126b, a patterned ohmic layer 124, and a patterned polycrystalline silicon layer 122b, is formed.

Figure 5:
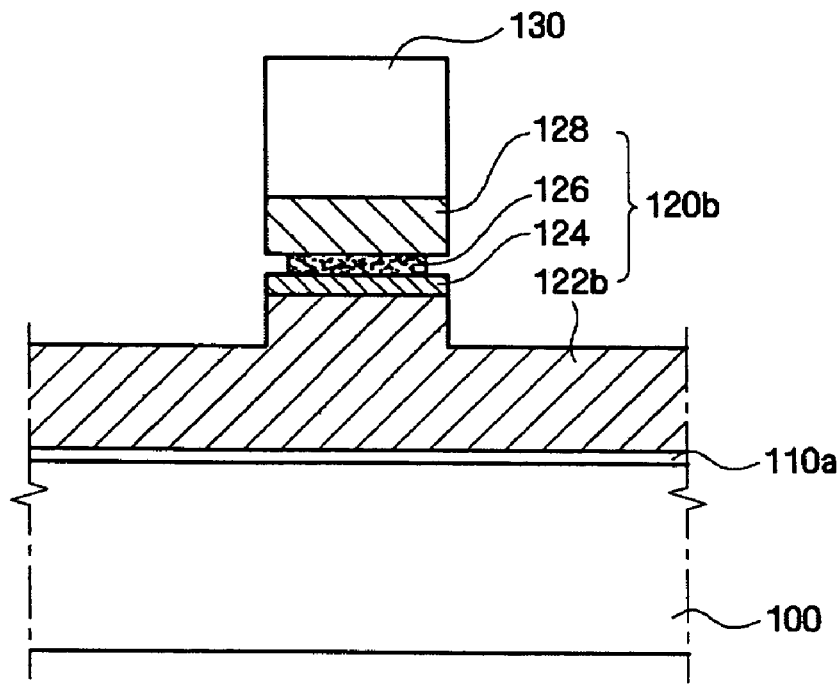

Referring to FIGS. 2 and 5, then side portions of the barrier layer 126 are removed by an etching process, example, e.g., a wet etching process (S30). In this respect, the etchant has an etch selectivity whereby the etchant will only etch the material of the barrier layer 126. Thus, recesses are formed in both sides of the patterned structure constituting the gate electrode.

Figure 6:
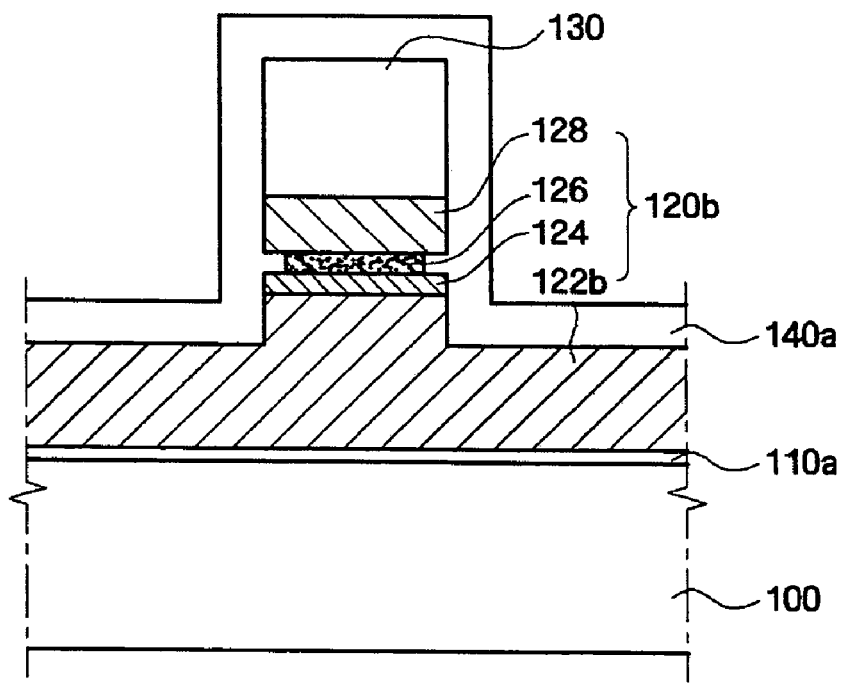
Figure 7:
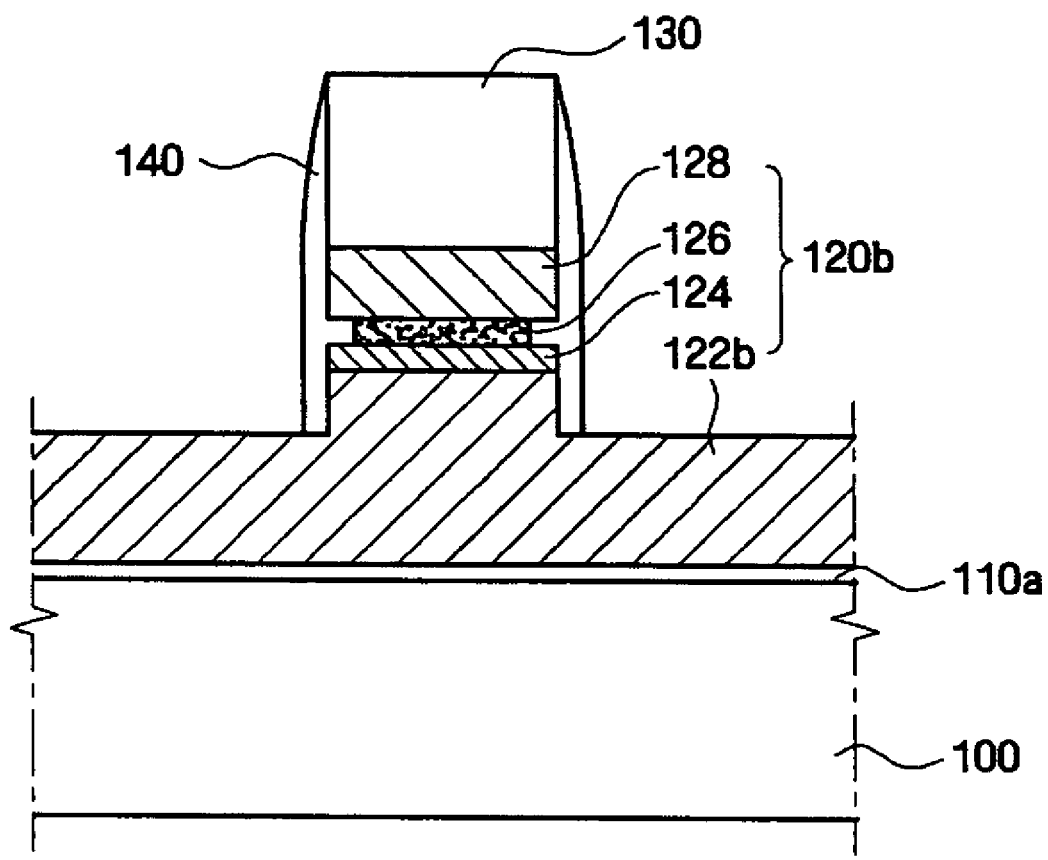

Referring to FIGS. 2, 6, and 7, the first spacers 140 are formed over the sides of the metal layer 128, the barrier layer 126b, and the ohmic layer 124, and over portions of the sides of the polycrystalline silicon layer 122b (S40). More specifically, referring to FIG. 6, a conformal insulating film 140a is formed over the entire surface of the substrate 100 so as to conformally cover the patterned structure of the metal layer 128, barrier layer 126b, ohmic layer 124, and polycrystalline silicon layer 122b. In this respect, the insulating film 140a may be an oxide film or a nitride film formed by CVD. As a result, the insulating film 140a also fills the recesses defined at the sides of the barrier layer 126b. Next, referring to FIG. 7, the insulating film 140a is anisotropically etched to form the first spacers 140. The etching process is designed so that the first spacers 140 will have a thickness, adjacent the sides of the barrier layer 126, sufficient to prevent the barrier layer 126 from being oxidized when a subsequent oxidation process is carried out.

Figure 8:
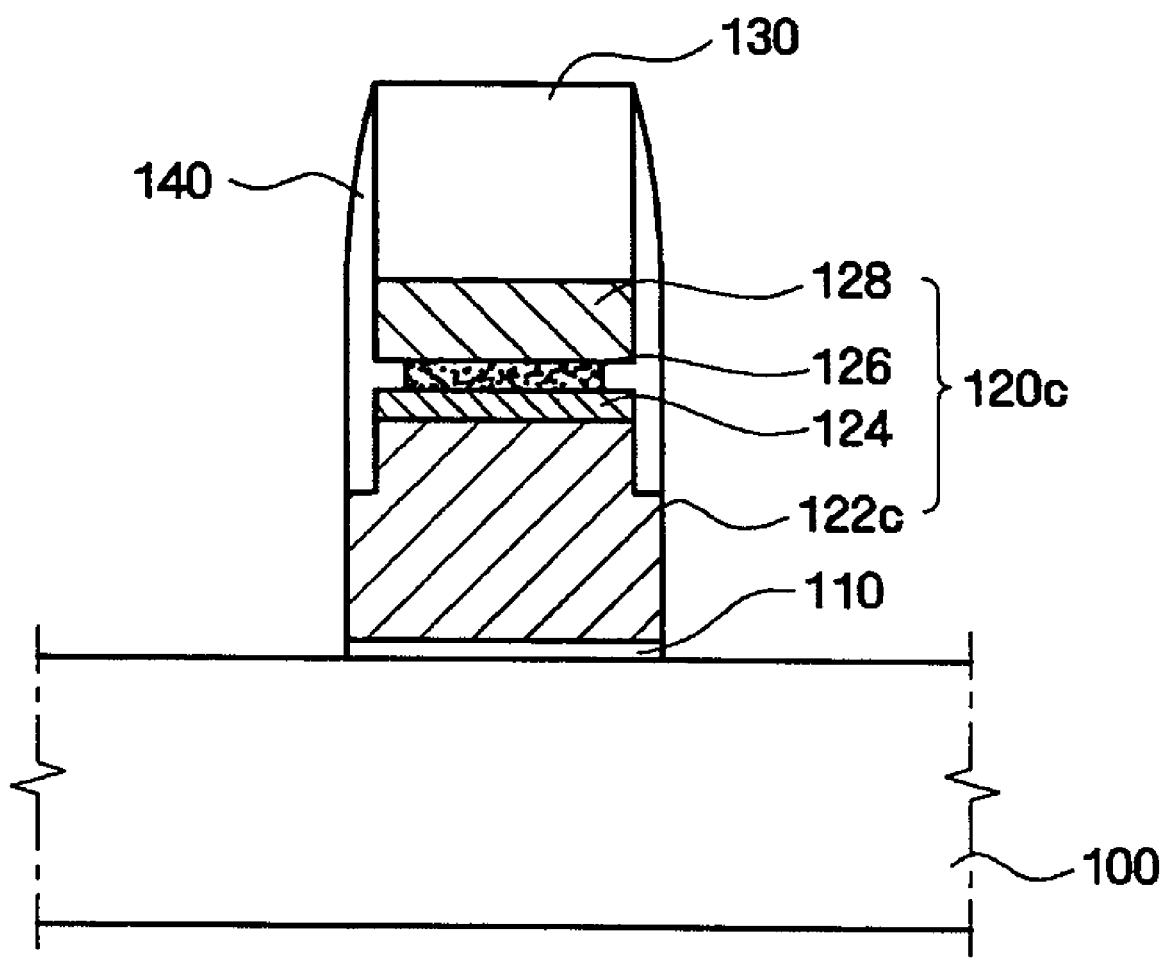

Referring to FIG. 8, the polycrystalline silicon layer 122b and the gate insulating film 110a are etched using the first spacers 140 and the hard mask 130 as an etch mask (S50). In this case, the polycrystalline silicon layer 122a and the gate insulating film 110a may be dry etched. As a result, the stacked or line structure now also comprises a patterned and etched polycrystalline layer 122b and an etched gate insulating film 110.

Figure 9:
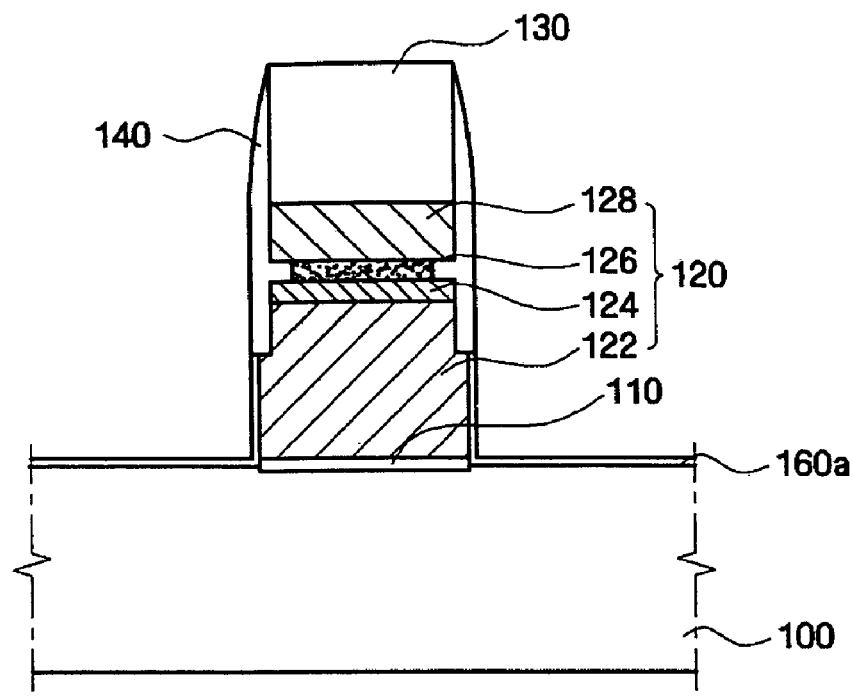

Referring to FIGS. 2 and 9, the resultant structure is then subjected to an oxidation process (S60). The oxidation process removes defects from the gate electrode 120 or the substrate 100, e.g., eliminates hot carriers, thereby improving the reliability of the semiconductor device. The oxidation process also forms an oxide film 160a over the side portions of the polycrystalline silicon layer 122c which are not covered by the first spacers 140 and over the surface of the substrate 100 which is not occupied by the gate insulating film 110. The oxidation process may be a thermal process. Alternatively, the oxidation process may be a wet oxidation process or a radical oxidation process, or may be carried out in combination with a nitridation process such as a thermal nitridation or plasma nitridation process. In any case, as described above, the barrier layer 126 is not oxidized because it is protected by the relatively thick portions of the first spacers 140.

Figure 10:
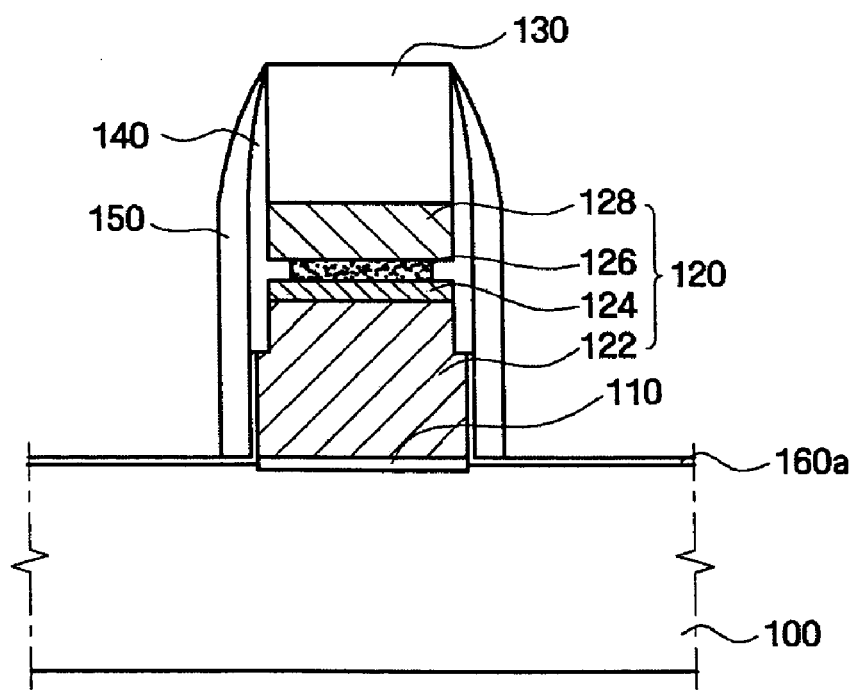

Referring to FIGS. 2 and 10, second spacers 150 are formed along the sides of the first spacers 140 and (lower) side portions of the polycrystalline silicon layer 122 which are not covered by the first spacers 140 (S70). The second spacers 150 are formed by forming a conformal insulating film over the structure, i.e., over the gate electrode 120 and the entire surface of the substrate 100, and anisotropically etching the insulating film.

Referring again to FIG. 1, source/drain regions 170 are formed on the substrate 100 (S80). Specifically, the substrate 100 is implanted with ions while using the oxide film 160 on the substrate 100 as an oxide film. Then, the portions of the oxide film 160 exposed on the substrate 100 are removed. The resultant structure thus constitutes a transistor.

Next, lines for inputting or outputting signals to or from the transistor are formed on the substrate 100, a passivation layer is formed on the substrate, and the substrate is packaged. These latter steps, per se, are widely known to those of ordinary skill in the art. Accordingly, a detailed description of these steps will be omitted for the sake of clarity.

According to the present invention as described above, the first spacers can be made thick enough to prevent oxidation at the barrier layer. Accordingly, the semiconductor device has excellent operating characteristics. Secondly, even though the first spacers are thick enough to prevent oxidation at the barrier layer, the first spacers do not add significantly to the overall width of the transistor because the widest portions of the spacers are accommodated in recesses in the sides of the gate electrode. Therefore, the transistor remains compact and thus, the present invention can be used to realize highly integrated semiconductor devices.

Finally, although the present invention has been described in connection with the preferred embodiments thereof, it is to be understood that the scope of the present invention is not so limited. On the contrary, various modifications of and changes to the preferred embodiments will be apparent to those of ordinary skill in the art. Thus, changes to and modifications of the preferred embodiments may fall within the true spirit and scope of the invention as defined by the appended claims.

What is claimed is:

1. A semiconductor device comprising:
   a semiconductor substrate having source/drain regions, and a channel region located between the source/drain regions;
   a gate insulating film disposed on the channel region of the semiconductor substrate;

a gate electrode disposed on the gate insulating film, the gate electrode comprising a polycrystalline silicon (polysilicon) layer, an ohmic layer, a barrier layer, and a metal layer disposed one atop the other in the foregoing sequence, and wherein the gate electrode has recesses in both sides thereof adjacent sides of the barrier layer;

a hard mask disposed on the gate electrode; and first spacers extending over sides of the hard mask, the metal layer, the barrier layer, and the ohmic layer, and over side portions of the sides of the polycrystalline silicon layer, respectively.

2. The semiconductor device of claim 1, wherein the metal layer is a layer of tungsten (W).

3. The semiconductor device of claim 1, wherein the barrier layer is a layer of material selected from the group consisting of TiN, TaN, and BN.

4. The semiconductor device of claim 1, wherein the ohmic layer is a layer of material selected from the group consisting of titanium suicide ($TiSi_x$), tantalum silicide ($TaSi_x$, cobalt silicide ($CoSi_x$), tungsten silicide ($Wsi_x$), and molybdenum silicide ($MoSi_x$).

5. The semiconductor device of claim 1, flitter comprising second spacers extending over sides of the first spacers and side portions of to polycrystalline silicon layer which are not covered by the first spacers, and an oxide film extending along the side portions of the polycrystalline silicon layer which are not covered by the first spacers and along portions of the substrate located beneath the second spacers.

6. The semiconductor device of claim 1, wherein the gate electrode has a width of about 500Å, the recesses are each about 25-75Å deep as measured in the widthwise direction of the gate electrode, and the first spacers each have a thickness of about 50-100Å as taken in the widtwise direction of the gate electrode adjacent the baffler layer.

7. The semiconductor device of claim 1, wherein the first spacers are constituted by one of an oxide film and a nitride film.

8. The semiconductor device of claim 1, wherein the baffler layer has a width that is less tan that of the layers that are disposed directly on top of and below the barrier layer such that the bottoms of the recesses are defined by the sides of the barrier layer, respectively.

9. The semiconductor device of claim 1, wherein the first spacers extend into and occupy the recesses, respectively, and each of the first spacers has a thickness which is greatest adjacent the barrier layer.

10. The semiconductor device of claim 8, wherein the first spacers extend into and occupy the recesses, respectively, such that the thickness of each of the first spacers as taken at the sides of the baffler layer is greater than the thickness of the first spacer as taken at the layers that are disposed directly on top of and below the baffler layer.

11. The semiconductor device of claim 10, wherein the gate electrode has a width of about 500Å, the recesses are each about 25-75Å deep as measured in the widthwise direction of the gate electrode, and the first spacers each have a thickness of about 50-100Å as taken in the widthwise direction of the gate electrode adjacent the baffler layer.

12. The semiconductor device of claim 11, further comprising second spacers extending over sides of the first spacers and side portions of the polycrystalline silicon layer which are not covered by the first spacers, and an oxide film extending along the side portions of the polycrystalline silicon layer which are not covered by the first spacers and along portions of the substrate located beneath the second spacers.

* * * * *